United States Patent [19]

Rahim

[11] Patent Number: 4,616,172
[45] Date of Patent: Oct. 7, 1986

[54] VOLTAGE GENERATOR FOR TELECOMMUNICATION AMPLIFIER

[75] Inventor: Chowdhury F. Rahim, Bridgewater, N.J.

[73] Assignee: AT&T Bell Laboratories, Murray Hill, N.J.

[21] Appl. No.: 566,823

[22] Filed: Dec. 29, 1983

[51] Int. Cl.⁴ .............................................. G05F 3/24
[52] U.S. Cl. ................ 323/313; 307/296 R; 307/304
[58] Field of Search ................. 307/304, 296 R, 297; 323/313, 314, 311, 312; 330/261

[56] References Cited

U.S. PATENT DOCUMENTS

| | | | |
|---|---|---|---|
| 3,806,742 | 4/1974 | Powell | 307/297 |
| 3,823,332 | 7/1974 | Feryszka et al. | 323/313 |
| 4,267,501 | 5/1981 | Smith | 323/313 |

FOREIGN PATENT DOCUMENTS

| | | | |
|---|---|---|---|
| 4647 | 1/1980 | Japan | 323/313 |
| 48303 | 3/1983 | United Kingdom | 323/313 |
| 1061121 | 12/1983 | U.S.S.R. | 323/313 |

Primary Examiner—William H. Beha, Jr.
Attorney, Agent, or Firm—David I. Caplan

[57] ABSTRACT

Field effect transistor voltage generator circuitry, particularly useful with CMOS operational amplifiers, uses a first branch circuit which contains transistors which mirrors transistors of the amplifier and uses a second branch circuit which functions to bias the first branch circuit. At least one feedback path exists from the first branch circuit to the second branch circuit to help maximize the dynamic range of the amplifier by generating reference potentials which are as far apart as is practical.

8 Claims, 3 Drawing Figures

VOLTAGE GENERATOR FOR TELECOMMUNICATION AMPLIFIER

TECHNICAL FIELD

This invention relates to voltage generator circuitry useful with operational amplifiers and in particular to voltage generator circuitry useful with operational transconductance amplifiers suited for use with switched capacitor filters.

BACKGROUND OF THE INVENTION

Many of today's operational complementary metal-oxide-silicon (CMOS) field effect transistor (FET) amplifiers used in telecommunication applications require reference voltages which track fabrication processing variations. Voltage generator circuits which generate the needed reference voltages typically use circuitry which mirrors the amplifier circuitry. Standard transistor-resistor divider networks are typically used to bias the circuitry of the voltage generator. One problem with this type of voltage generator circuitry is that it does not optimize the output reference levels such that the dynamic range (output voltage swing) of the amplifier is maximized.

It is desirable to have voltage generator circuitry which generates reference voltage levels that tend to optimize the dynamic range of operational amplifiers.

SUMMARY OF THE INVENTION

The present invention is directed to voltage generator circuitry which supplies reference voltages to a target circuit such as an operational transconductance amplifier. The voltage generator circuitry has a first branch circuit having a first group of interconnected field effect transistors which are coupled by a circuitry output terminal to the target circuit. Some of the transistors of the first branch circuit are essentially the same size and kind and have the same electrical characteristics and the same general configuration as transistors of the target circuit. The voltage generator circuitry also has a second branch circuit having a second group of interconnected field effect transistors. An output terminal of the second branch circuit is coupled to an input terminal of the first branch circuit. The second branch circuit is adapted to bias the first branch circuit and has at least one transistor which has the gate and one output terminal thereof coupled to an output terminal and a gate terminal of a transistor of the first branch circuit. The feedback arrangement of the transistors of the first and second branch circuits, as well as the matching of transistors of the first branch circuitry and the target circuitry, tends to result in the dynamic range of the operational transconductance amplifier being essentially as large as is reasonably possible.

In a preferred embodiment the voltage generator circuitry is adapted to be connectable to the same power supplies used with the operational transconductance amplifier, the current in the first branch circuit is substantially greater than in the second branch circuit, and the threshold voltages of all field effect transistors are essentially the same.

These and other features and advantages of the invention are better understood from a consideration of the following detailed description taken in conjunction with the accompanying drawings.

DETAILED DESCRIPTION

Figure 1:
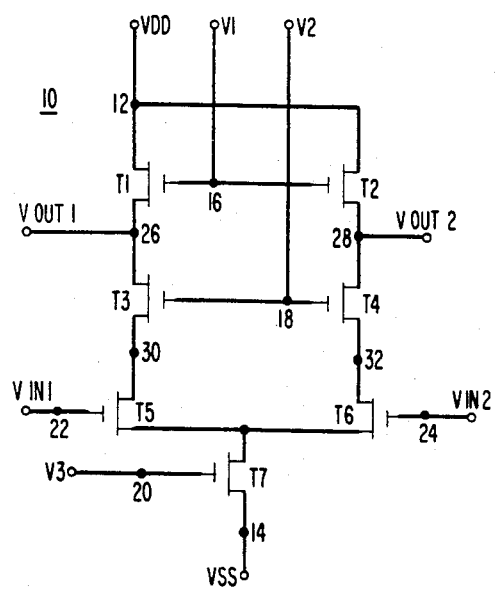
FIG. 1 illustrates an amplifier.
Figure 2:
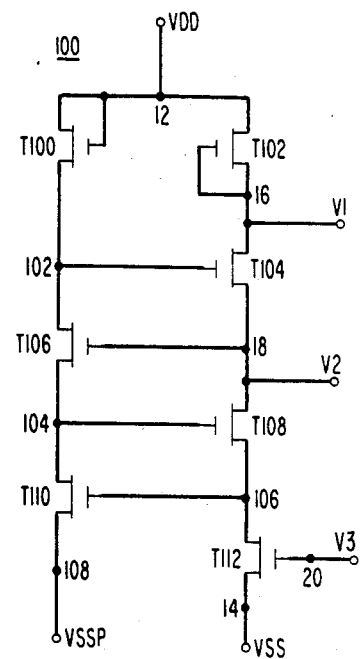
FIG. 2 illustrates first voltage generator circuitry in accordance with the present invention and useful with the amplifier of FIG. 1.

Referring now to FIG. 1, there is illustrated an amplifier 10 which includes first and second load devices comprising field effect transistors T1 and T2, third and fourth cascode switching devices comprising field effect transistors T3 and T4, fifth and sixth differential devices comprising field effect transistors T5 and T6, and a current source comprising field effect transistor T7. The gates of T1 and T2 are coupled to terminal 16 and to a first reference potential V1 and the gates of T3 and T4 are coupled to a terminal 18 and to a second reference potential V2. V1 and V2 are generated by voltage generator circuitry 100 which is illustrated in FIG. 2 herein and is the subject of the present invention. The amplifier 10 of FIG. 1 is the subject of a separate application, now U.S. Pat. No. 4,533,877 issued to C. F. Rahim on Aug. 6, 1985 entitled "Telecommunication Operational Amplifier", and which has a common assignee. The gate of T7 is coupled to a terminal 20 and to a third voltage reference V3 which is generated by voltage generator 1000 circuitry illustrated in FIG. 3 herein.

In a preferred embodiment, T1 and T2 are p-channel insulated gate field effect transistors and T3, T4, T5, T6, and T7 are n-channel insulated gate field effect transistors. The sources of T1 and T2 are coupled together to a terminal 12 and to a power supply VDD. The source of T7 is coupled to a terminal 14 and to a power supply VSS. The gate terminal of T5 is coupled to a terminal 22 and to a first source of input signals VIN1. The gate terminal of T6 is coupled to a terminal 24 and to a second source of input signals VIN2. VIN1 and VIN2 provide complementary input signals. The drains of T1 and T3 are coupled to a terminal 26, and to a first output terminal VOUT1 of amplifier 10. The drains of T2 and T4 are coupled to a terminal 28, and to a second output terminal VOUT2 of amplifier 10. VOUT1 and VOUT2 have complementary output signals and either one or both may be used in any particular application. The source of T3 is coupled to the drain of T5 and to a terminal 30. The source of T4 is coupled to the drain of T6 and to a terminal 32. The sources of T5 and T6 are coupled to a terminal 34 and to the drain of T7. The drain and source terminals of a field effect or metal-oxide-silicon transistor change as a function of the direction of current flowing therethrough. The drain and source terminals may be referred to as first and second or second and first output terminals of the transistor with the gate referred to as a control terminal. The transistors may be referred to as switching devices or just devices. T1 and T2 may be denoted as load devices; T3 and T4 may be denoted as cascode devices or cascode switching devices; T5 and T6 may be denoted as a differential pair, differential switching devices, or just devices. T7 may be denoted as a current source or current source device of a switching device.

Referring now to FIG. 2, there is illustrated voltage generator circuitry 100 in accordance with the invention which generates at an output terminal 16 a V1 output voltage level and generates at an output terminal 18 a V2 output voltage level. V1 and V2 are the voltage levels used by amplifier 10 of FIG. 1. Circuitry 100 comprises field effect transistors T100, T102, T104, T106, T108, T110, and T112.

The drain and gate of T100 and the source of T102 are coupled to terminal 12 and to power supply VDD. The gate and drain of T102 are coupled to the drain of T104 and to a terminal 16 at which reference potential V1 is generated. The source of T100, the gate of T104, and the drain of T106 are all coupled to a terminal 102. The source of T104, the gate of T106, and the drain of T108 are all coupled to a terminal 18 at which the reference potential V2 is generated. The source of T106, the gate of T108, and the drain of T110 are all coupled to a terminal 104. The source of T108, the gate of T110, and the drain of T112 are all coupled to a terminal 106. The gate of T112 is coupled to terminal 20 and to a reference potential V3. The source of T110 is coupled to terminal 14 and to power supply potential VSS. The source of T110 is coupled to a terminal 108 and to a source of potential VSSP. VSSP is typically approximately 0.7 volts more positive in potential than VSS.

Circuitry 100 is designed to provide amplifier 10 of FIG. 1 with the needed reference potentials V1 and V2. The physical size, type of transistor, and threshold voltge of T102 is selected to be essentially identical to the corresponding parameters of T1 and T2. The physical size, type of transistor, and threshold voltage of T104 is selected to be essentially identical to the corresponding parameters of T3 and T4. The physical size, type of transistor, and threshold voltage of T108 is selected to be essentially identical to the corresponding parameters of T5 and T6. The serial connection of T102, T104, and T108 is very similar to the serial connection of T1, T3, and T5, and to the serial connection of T2, T4, and T6. The current level generated through T102, T104, and T108 is essentially identical to the current level through T1, T3, and T5, which is essentially equal to that through T2, T4, and T6. T112 is one-half the size of T7 and has the same applied gate potential, V3, and source potential, VSS, as has T7. The combination of T102, T104, T108 and T112 may be denoted as a first branch circuit. The combination of T100, T106, and T110 may be denoted as a second branch circuit. The current generated by T7 is essentially twice that generated through T112; however, only half of the current through T7 flows through T1, T3, and T5, and the other half flows through T2, T4, and T6. The combinations of T1, T3, T5, and T7, and T2, T4, T6, and T7, and T102, and T104, T108 and T112 are all coupled at one end to VDD and at the other end to VSS. All of these common characteristics tend to result in output voltages V1 and V2 of voltage generator circuitry 100 being compensated for semiconductor processing variations, assuming that amplifier 10 and voltage generator circuitry 100 are fabricated together in a single silicon chip and use the same supply.

As will be discussed subsequently herein, variations in the potential level of VSS are compensated for by corresponding changes in the level of V3 by voltage generator circuitry 1000 of FIG. 3. Accordingly, variations in the level of VSS essentially cause no change in the current level through the combinations of T1, T3, T5, and T7, and T2, T4, T6, and T7, and T102, T104, T108, and T112. Typically VSSP is generated from VSS using a clipper circuit (not illustrated). This helps ensure that voltage variations of VSS do not result in corresponding voltage variations in the level of VSSP. This contributes to keeping the current level through T100, T106, and T110 relatively constant and thus helps maintain output voltage references V1 and V2 at the desired levels.

Typically the current flowing through T102, T104, T108, and T112 is significantly greater than that that flows through T100, T106, and T110. This results in the voltage needed, ΔV, above the threshold voltage of each of the transistors T100, T106, and T110, to conduct a preselected current within the saturation region of operation, to be significantly less than the corresponding ΔV of each of T102, T104, and T108. This, combined with the feedback configuration of T104, T106, T108, and T110, results in the potential of V2 being as separated from V1 as is reasonably possible such that all transistors of amplifier 10 operate in the saturation region but such that the widest reasonably possible output voltage swings occur at output terminals VOUT1 and VOUT2 of amplifier 10. This serves to tend to maximize the dynamic range of amplifier 10.

In some applications it is desirable to provide input terminals VIN1 and VIN2 of amplifier 10 with a common d-c offset level. The potential appearing at terminal 104 is at one such level and as such can be coupled to VIN1 and VIN2 through separate n-channel field effect transistors (not illustrated).

Figure 3:
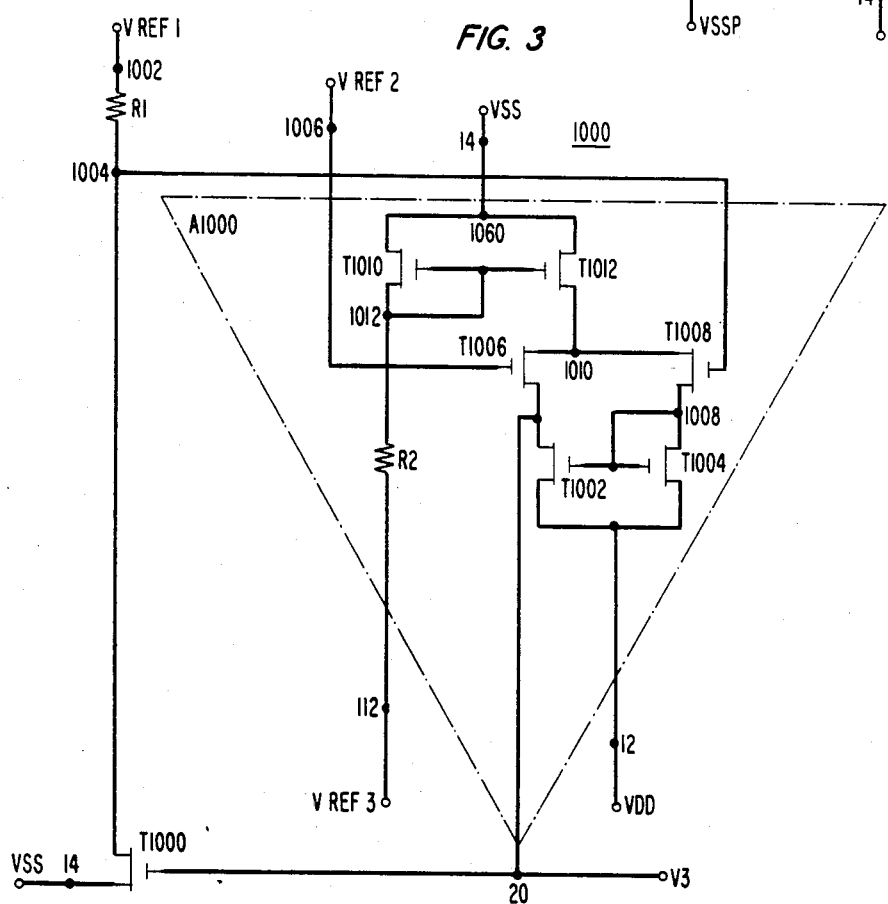
FIG. 3 illustrates second voltage generator circuitry useful with the amplifier of FIG. 1.

Referring now to FIG. 3, there is illustrated voltage generator circuitry 1000 which generates at an output terminal 20 the reference voltage V3 needed by amplifier 10 of FIG. 1 and by voltage generator circuitry 100 of FIG. 2. Circuitry 1000 comprising a first resistor R1, a switching device which comprises a field effect transistor T1000, and an operational amplifier which is illustrated in dashed line triangle A1000 and will be denoted as A1000. A first terminal of R1 is coupled to a terminal 1002 and to a reference potential V Ref1. A second terminal of R1 is coupled to a first input terminal of A1000, to the drain of T1000 and to a terminal 1004. Output terminal 20 of A1000 is coupled to the gate of T1000 and serves as the output terminal of circuitry 1000 at which reference potential V3 is generated. The source of T1000 is coupled to terminal 14 and power supply potential VSS. A second input terminal of A1000 is coupled to a terminal 1006 and to a reference potential Vref2 which is typically ground (0 volts).

Voltage generator circuitry 1000 generates at output terminal 20, a potential V3 which varies with any variations of VSS such that the current through T1000 and through T7 of amplifier 10 of FIG. 1, and through T112 of voltage generator circuitry 100 of FIG. 2 remains essentially constant even with variation in the potential level of VSS. VRef1 is generated typically by circuitry (not illustrated) which is powered by VDD and VSS. This circuitry is designed to provide a VRef1 level which is tightly regulated and varies little even if there is variation in the levels of VDD and VSS. Accordingly, VRef1 contributes little variation in output voltage V3.

Amplifier 1000 is illustrated as comprising n-channel IGFETS T1002 and T1004, and p-channel IGFETS T1006, T1008, T1010, and T1012. The drains of T1002 and T1004 are coupled to terminal 12 and to VDD. The sources of T1002 and T1006 are coupled to the gate of T1000, and to output terminal 20. The gates of T1002 and T1004 are coupled to the sources of T1004 and T1008 and to a terminal 1008. The gate of T1006 is coupled to a terminal 1006 and to a reference potential VRef2. The gate of T1008 is coupled to terminal 1004. The drains of T1006 and T1008 are coupled to the source of T1012 and to a terminal 1010. The drains of T1010 and T1012 are coupled to terminal 14 and VSS. The gates of T1010 and T1012 are coupled to the source of T1010, to a first terminal of a resistor R2, and to a terminal 1012. A second terminal of R2 is coupled to terminal 12 and to a reference potential VRef3.

A variety of a different type of differential amplifiers or operational differential amplifiers can be used other than the specific circuitry illustrated. In this particular embodiment, VRef2 and VRef3 are the same.

Amplifier 10 of FIG. 1, voltage generator 100 of FIG. 2, and voltage generator 1000 of FIG. 3 have been fabricated in a single silicon chip and tested and found to be fully functional. In the fabricated chip VDD=+5 volts, VSS=−5 volts, V1=2.12 Volts, V2=2.0 volts, V3=−4.0 volts, VSSP=4.3 volts, VRef1=-VRef3=2.75 volts, VRef2=0 volts, R1=135,000 ohms, and R2=25,000 ohms. Transistors T1, T2, T3, T4, T5, T6, T7, T100, T102, T104, T106, T108, T110, T112, T1000, T1006, T1008, T1010, T1012, T1002, and T1004 are of p, p, n, n, n, n, n, n, p, n, n, n, n, n, p, p, p, p, p, n, and n-channel, respectively. The average d-c level of VIN1 and VIN2 is −2.75 volts and the average input a-c voltage swing is approximately ±3 millivolts. The average d-c level at VOUT1 and VOUT2 is 0 volts and the output voltage swing is approximately ±3.5 volts. The open loop gain of amplifier 10 is approximately 3000. The unity gain bandwidth is approximately 12 MHz with a load capacitance of 12 picofarads on each of terminals 26 and 28. The equivalent input rms noise is 12 nanovolts/Hz (Broadband). The power supply rejection for VDD using a 1 KHz signal is 68 db; using a 10 KHz signal is 65 db; and using a 100 KHz signal is 58 db. The power supply rejection for VSS using a 1 KHz signal is 84 db; using a 10 KHz signal is 75 db; and using a 100 KHz signal is 57 db.

The embodiments described herein are intended to be illustrative of the general principles of the present invention. Various modifications are possible consistent with the spirit of the invention. For example, T102 can be an n-channel transistor and T100, T104, T106, T108, T110, and T112 can be p-channel transistors. Still further, T100 could be replaced by a resistor. Still further, the number of transistors of the first branch circuit and the configuration of same is selected to mirror the circuit which needs the reference voltage and may be referred to as the target circuit. The number of transistors of the second branch circuit will corresponding change as can the number of generated reference voltages.

What is claimed is:

1. Voltage generator circuitry, supplying a first reference voltage to target circuitry, comprising:
a first branch circuit comprising a first plurality of interconnected field effect transistors with at least one circuitry output terminal coupled thereto;
a second branch circuit comprising a second plurality of interconnected field effect transistors having at least one output terminal which is coupled to an input terminal of the first branch circuit;
said second branch circuit being adapted to bias the first branch circuit, said second branch circuit containing at least one transistor, said one transistor having a gate terminal and one of its two output terminals coupled respectively to one of two output terminals and to a gate terminal of one of the transistors of the first branch circuit;
the target circuitry having at least a first reference voltage supply input terminal; and
conductive means for connecting the other of the two output terminals of said one of the transistors of the first branch circuit to the first reference voltage supply input terminal of the target circuitry.

2. The circuitry of claim 1 wherein the voltage generator circuitry and the targetry circuitry each has a separate power supply terminal connected to a common power supply.

3. The voltage generator circuitry of claim 2 wherein during operation a current level through the first branch circuit is substantially greater than a current level through the second branch circuit.

4. The voltage generator circuitry of claim 3 wherein all the transistors have threshold voltages that are approximately mutually equal.

5. The voltage generator circuitry of claim 4 wherein:
the first branch circuit comprises first (T102), second (T104), third (T108), and fourth (T112) transistors and the second branch circuit comprises fifth (T100), sixth (T106), and seventh (T110) transistors;
the first, second, third, fourth, fifth, sixth, and seventh transistors being p, n, n, n, n, n, and n-channel field effect transistors each having a gate terminal and first and second output terminals;
the first output terminal of T102 being coupled to the gate terminal and first output terminal of T100 and being connectable to a first power supply VDD;
the gate terminal and second output terminal of T102 being coupled to the first output terminal of T104 and to a first output terminal of the voltage generator circuitry;
the gate terminal of T104 being coupled to the second output terminal of T100 and to the first output terminal of T106;
the second output terminal of T104 being coupled to the gate terminal fo T106, to the first output terminal of T108, and to a second voltage generator circuitry output terminal;
the gate terminal of T108 being coupled to the second output terminal of T106 and to the first output terminal of T110;
the second output terminal of T108 being coupled to the gate terminal of T110 and to the first output terminal of T112;
the second output terminal of T112 being connectable to a second power supply VSS; and
the second output terminal of T110 being connectable to a source of a second reference voltage.

6. The voltage generator circuitry of claim 5 wherein a third output voltage generator circuitry terminal is coupled to the gate terminal of T112.

7. The voltage generator circuitry of claim 6 wherein the voltage level of the second reference voltage is between the voltage levels of the first and second power supplies.

8. Circuitry according to claim 1 in which a number of the transistors in the first plurality have essentially the same configuration, size and electrical characteristics as, and are of essentially the same kind as, a number of transistors in the target circuitry.

* * * * *